United States Patent [19]
Corley et al.

[11] Patent Number: 5,089,599
[45] Date of Patent: Feb. 18, 1992

[54] THERMOSETTING RESIN COMPOSITION COMPRISING BIS-IMIDE AND BIS-OXAZOLINE

[75] Inventors: Larry S. Corley; Kenneth C. Dewhirst, both of Houston, Tex.

[73] Assignee: Shell Oil Company, Houston, Tex.

[21] Appl. No.: 589,838

[22] Filed: Sep. 26, 1990

[51] Int. Cl.$^5$ .............................................. C08G 73/12
[52] U.S. Cl. .................... 528/322; 524/606; 528/170; 528/321
[58] Field of Search ............. 528/322, 321, 170; 524/606

[56] References Cited

U.S. PATENT DOCUMENTS 4,600,766 7/1986 Arita et al. .................... 528/322
4,931,512 6/1990 Matsumura et al. ............. 525/333.3

Primary Examiner—Harold D. Anderson

[57] ABSTRACT

A modified bisimide resin is prepared by copolymerizing a bisimide monomer and a bisoxazoline. The copolymerization of a bisimide with a bisoxazoline such as 2,2'-(1,3-phenylene)bisoxazoline provides a modified bisimide having improved fracture toughness.

24 Claims, No Drawings

THERMOSETTING RESIN COMPOSITION COMPRISING BIS-IMIDE AND BIS-OXAZOLINE

BACKGROUND OF THE INVENTION

This invention relates to thermosettable bisimide compositions. In one aspect, the invention relates to the preparation of cured bismaleimide resins having enhanced fracture toughness.

Advanced composites are high-performance materials made up of a fiber-reinforced thermoplastic or thermosettable material. The thermosettable materials useful in advanced composites must meet a demanding set of property requirements. For example, such materials optimally have good high-temperature properties such as high (above 200° C.) cured glass transition temperature and relatively low (less than 4%) water absorbance at elevated temperature. Such material must also exhibit high mechanical strength, as measured by fracture toughness and compression after impact. For ease of processing in preparing prepregs for composite parts, the uncured material will ideally have a low (below 120° C.) melting temperature.

Bismaleimide resins are thermosettable resins with much promise for use in advanced composites. Disadvantages of bismaleimides, however, include brittleness and high melting points, the latter of which requires most bismaleimides to be used with solvents for acceptable processability.

It is therefore an object of the invention to provide bisimide resin compositions having enhanced physical properties for composites applications.

BRIEF SUMMARY OF THE INVENTION

According to the invention, a curable composition is provided comprising a bisimide and a bisoxazoline. The copolymerization of the bisimide and bisoxazoline provides a cured bisimide composition having enhanced fracture toughness and flexural strength.

DETAILED DESCRIPTION OF THE INVENTION

The invention composition includes a bisimide. Preferred bisimides include N,N'-bisimides of unsaturated dicarboxylic acids which can be represented by the formula

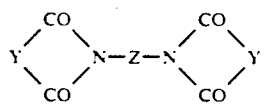

in which Y is a substituted or unsubstituted divalent group containing at least 2 carbon atoms, preferably 2 to 6 carbon atoms, and a carbon-carbon double bond, and Z is a divalent radical comprising at least 1, generally about 1 to 40 carbon atoms. Z can be aliphatic, cycloaliphatic, aromatic or heterocyclic. A preferred class of bisimides are bismaleimides derived from an aromatic diamine which can be represented by the formula

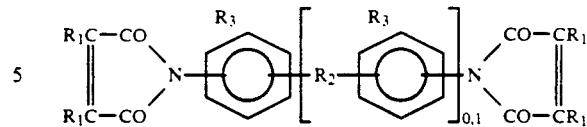

in which each $R_1$ is selected independently from H, $C_{1-2}$ alkyl or halide; $R_2$ is selected from divalent hydrocarbon radicals containing from about 1 to about 10 carbon atoms, —O—, —SO$_2$—, —COO—, —CONH—, —CO— and —S—; and each $R_3$ is selected independently from H, $C_{1-3}$ alkyl and halide.

Specific examples of bisimides include
1,2-bismaleimidoethane
1,6-bismaleimidohexane
1,3-bismaleimidobenzene
1,4-bismaleimidobenzene
2,4-bismaleimidotoluene
4,4'-bismaleimidodiphenylmethane
4,4'-bismaleimidodiphenyl ether
3,3'-bismaleimidodiphenyl sulfone
4,4'-bismaleimidodicyclohexylmethane
3,5-bis(4-maleimidophenyl)pyridine
2,6-bismaleimidopyridine
1,3-bis(maleimidomethyl)cyclohexane
1,3-bis(maleimidomethyl)benzene
1,1-bis(4-maleimidophenyl)cyclohexane
1,3-bis(dichloromaleimido)benzene
4,4'-biscitraconimidodiphenylmethane
2,2-bis(4-maleimidophenyl)propane
1-phenyl-1,1-bis(4-maleimidophenyl)ethane
α,α-bis(4-maleimidophenyl)toluene
3,5-bismaleimide-1,2,4-triazole
and various bismaleimides disclosed in U.S. Pat. Nos. 3,562,223, 4,211,860 and 4,211,861. Bismaleimides can be prepared by methods known in the art, as described in U.S. Pat. No. 3,018,290, for example.

The bisimide resin can contain imide oligomer according to the formula

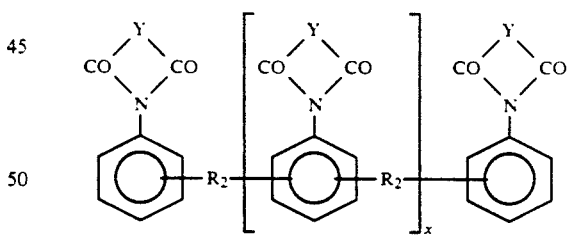

in which x is a number within the range of about 0 to about 0.5. Such oligomers may be present as an impurity in difunctional bisimides.

The preferred bisimide resin is N,N'-4,4'-diphenylmethane bismaleimide. The bisimide can contain various additives and modifiers as processing aids. The bisimide resin component can be a reaction product or prepolymer of a bisimide and an effective chain-extending agent such as an amine group-containing compound. Suitable amine group-containing compounds include diamines and polyamines represented by the general formula $(H_2N)_nQ$ or $(RNH)_nQ$ and aminophenols represented by the general formula $(NH_2)_nQ(OH)_n$ or $(RNH)_nQ(OH)_n$, in which Q is a divalent aromatic or alicyclic group and n is a number such that the average number of amine hydrogens per molecule in the amine mixture falls between about 1.95 and 2.5. Examples include bis(4-(N-methylamino)phenyl)methane, N,N'-dimethyl-1,3-diaminobenzene and the like. Such reaction products can be prepared by methods known in the art, such as contacting about 0.1 to about 0.8 mole of the chain-extending agent with each mole of the bisimide in an organic solvent at a temperature of about 40° to 200° for a time of about 5 minutes to 5 hours. The bisimide can be, for example, a hydrazide-modified bismaleimide as described in U.S. Pat. Nos. 4,211,860 and 4,211,861. Suitable N,N'-unsaturated bismaleimide resins are commercially available from Technochemie GmbH as Compimide ® resins, for example. The bisimide can be a mixture of bisimides described above tailored to meet specific processing requirements.

The invention composition includes a bisoxazoline. Suitable bisoxazolines can be represented by the formula

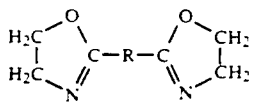

in which R is a divalent linking group R can be selected from a wide range of organic and inorganic moieties including, for example, alkylene, cycloalkylene, arylene and heterocyclic. In a preferred embodiment, the bisoxazoline can be described according to the formula

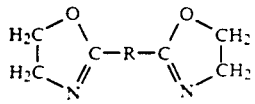

in which R' is substituted or unsubstituted phenylene or $C_{1-10}$ alkylene. Examples of bisoxazolines include 2,2'-(1,3-phenylene)bisoxazoline, 2,2'-(1,4-phenylene)bisoxazoline, 2,2'-hexamethylene bisoxazoline, 2,2'-ethylene bisoxazoline, 2,2'-(2,6-pyridinediyl)bisoxazoline, 2,2-(α,ω-polyoxyethylene)bisoxazoline, and the like. Such bisoxazolines can be prepared by a number of techniques in the literature such as the acid-catalyzed reactions of dinitriles with monoepoxides or the dehydrative reaction of monoethanolamine with dicarboxylic acids.

The bisimide and the bisoxazoline are combined in a molar ratio of bisoxazoline:bisimide within the range of about 0.2 to 5.0, preferably about 0.3 to about 3.0, most preferably about 0.5 to about 2.0, in order to achieve the desired physical properties in the cured composition.

The bisimide and bisoxazoline may be combined in any manner desired, such as melt, solution or powder blending. The preferred technique involves melting a mixture of the solid reactants at a temperature above the respective melting points but below the polymerization temperature of either monomer, and stirring the melt until a homogeneous mixture is achieved. The melt may also be held at temperatures above about 150° C. for desired periods of time in a process of prepolymerization to increase the crystallization resistance of the melt and/or to increase its viscosity to desired levels. The mixture can then be poured directly into a mold for polymerization, or it can be directly cooled for later polymerization.

The composition may contain an optional free radical inhibitor to inhibit free radical polymerizatoon of the bisimide monomer. Generally, the free radical inhibitor will be present in the composition in an amount within the range of about 0.0002 to about 0.02 moles per mole of the bisimide, preferably from about 0.001 to about 0.01 moles. The free radical inhibitor can be added to the monomers in any manner effective for intimate blending of the monomers and free radical inhibitor. Free radical inhibitors include phenols such as t-butylcatechol, hydroquinone and p-methoxyphenol; quinones such as 1,4-benzoquinone and 1,4-naphthoquinone; polynitro aromatics such as picric acid and 2,4,6-trinitrotoluene; hydroxylamines such as diethylhydroxylamine; stable radicals such as di-t-butylnitroxide or diphenylpicrylhydrazyl; and certain polycyclic heterocycles such as phenothiazine. The preferred free radical inhibitor is phenothiazine.

Polymerization is effected by heating the mixture to a temperature effective to initiate reaction between the functional groups of the bisoxazoline and the double bonds of the bisimide. The temperature is generally at least about 180° C., preferably within the range of about 200° to about 350° C., held for a time of about 2 hours or more, with the required reaction time dependent on the temperature-staging program used.

In order to achieve optimum properties in the copolymers, a mixture of the monomers and free radical inhibitor is heated at a temperature near or above the ultimate (fully cured) glass transition temperature of the copolymer composition for a time sufficient to produce essentially complete reaction of the monomers. "Essentially complete" reaction of the monomers has been reached when no further reaction exotherm is observed by differential scanning calorimetry (DSC) upon heating the copolymer. The time of the heat treatment, or "post-cure," will vary depending upon the monomers, the degree of pressure applied and any precuring of the monomer mixture.

The copolymers are useful as resin matrices for composites in aerospace and electronics applications, including large structural parts and circuit boards. Based on their long shelf life and relatively low melting point, some of the uncured mixtures are useful for making tacky prepregs which can then be molded into composites. They are also suitable for liquid resin processing methods such as filament winding, resin transfer molding, resin infusion molding, and pultrusion if the mixtures are heated to provide sufficiently low viscosity for fiber impregnation. They may also be suitable for electrical applications such as the manufacture of circuit boards.

For preparation of reinforced laminate materials, a fibrous substrate of glass, carbon, quartz, poly(p-phenyleneterephthalamide), polyester, polytetrafluoroethylene, poly(p-phenylenebenzobisthiazole), boron, paper or like material, in chopped, mat or woven form, is impregnated with a bisimide/bisoxazoline composition in molten or solution form. A prepreg is formed by heating the impregnated substrate in an oven at a temperature sufficient to remove the solvent and optionally to partially cure without gelation, or "B-stage," the resin system, generally about 180° C. to about 230° C., preferably about 200° to about 220° C., for a time of up to about 2 hours, preferably about 10 to about 40 minutes. A laminate is fabricated by subjecting a set of layered prepregs to conditions effective to cure the resins and to integrate the prepregs into a laminated structure. The laminate can optionally include one or more layers of a conductive material such as copper.

Laminating generally involves subjecting the prepregs to a temperature above about 200° C., preferably from about 210° to about 350° C., for a time of at least about 1 hour, at a pressure within the range of about 50 to about 500 psi.

For some laminating applications, especially if the bisimide/bisoxazoline mixture will be dissolved in a solvent before impregnation of the substrate, it may be advantageous to heat treat, or upstage, the bisimide/bisoxazoline mixture prior to application to a laminating substrate, particularly if the mixture will be stored prior to use. Suitable heat treatment involves subjecting the bisimide/bisoxazoline mixture to an elevated temperature for a time sufficient to cause sufficient reaction and viscosity increase to inhibit crystallization of either or both monomers from the mixture upon storage, but not sufficient to gel the composition.

EXAMPLE 1

Into a perfluoropolymer beaker were weighed 230.90 grams of 4,4'-bismaleimidodiphenylmethane, 38.90 grams of 2,4-bismaleimidotoluene, 36.90 grams of 1,3-bismaleimidobenzene, and 0.9286 grams of phenothiazine (added as an inhibitor to prevent radical polymerization of the bismaleimides on heating). The mixture was heated in an oil bath to 205° C., stirred until homogeneous, and allowed to cool to room temperature, solidifying to an amorphous mass. (We used this mixture instead of a single bismaleimide resin for ease of processing, in order to hinder the bismaleimide from crystallizing from its molten mixture with the bisoxazoline.) The mass was then broken up into small pieces and cocured with 2,2'-(1,3-phenylene)bisoxazoline as follows.

A blend of 3.0929 grams of the above bismaleimide mixture and 2.0078 grams of 2,2'-(1,3-phenylene)bisoxazoline was prepared in a glass beaker. It was held in an oil bath at 180° C. with stirring until homogeneous (about 4 minutes). The mixture was then poured into a mold formed from two sheets of glass separated by a 1/16" (1.6 mm) polytetrafluoroethylene spacer and held together by clamps. The mold was then placed into an oven and the mixture was cured for 90 minutes at 210° C., 15 minutes at 230° C., 15 minutes at 250° C., 15 minutes at 270° C., and 30 minutes at 290° C. The mold was then allowed to cool and the cured resin casting was removed from the mold. The dark hard glassy casting was free of visually apparent voids and showed no methylene chloride absorption after soaking in this solvent for 5 days at room temperature.

A second casting, which was ⅛" (3.2 mm) thick, was prepared from 12.3683 grams of the bismaleimide mixture and 8.0052 grams of the bisoxazoline. It was cured by the same cure schedule. This second casting also contained no evident voids. It showed a room temperature dry flexural strength (ASTM D-790) of 140 MPa, a flexural modulus of 5.02 GPa, a flexural elongation of 3.1%, and no dynamic mechanical Tg below 348° C. A corresponding casting prepared from the bismaleimide mixture alone (without the bisoxazoline) contained too many voids for mechanical properties to be determined. Another casting was prepared from a bismaleimide mixture alone which was similar to the bismaleimide mixture above except without phenothiazine. This casting was low in void content but was too brittle to be machined into samples for mechanical testing.

EXAMPLE 2

This example illustrates the use of a bisphenol as a coreactant with the bisimide/bisoxazoline mixture. Two mixtures were prepared and mixed at 180° C. as above in small glass beakers. The first mixture contained 1.0027 grams of the above bismaleimide blend, 1.0031 grams of 2,2'-(1,3-phenylene)bisoxazoline, and 0.3752 grams of bisphenol A. The second mixture contained 1.0986 grams of the above bismaleimide blend, 0.8625 grams of 2,2'-(1,3-phenylene)bisoxazoline, and 0.1638 grams of bisphenol A. The mixtures were then poured into 1/16"-thick molds as in Example 1 and cured by the cure schedule used in Example 1. Hard glassy castings were obtained.

I claim:

1. A composition comprising:
   (a) a bisimide of an unsaturated dicarboxylic acid which can be represented by the formula

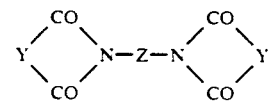

which Y is a substituted or unsubstituted divalent group containing at least 2 carbon atoms and a carbon-carbon double bond, and Z is a divalent linking group; and
   (b) a bisoxazoline compound represented by the formula

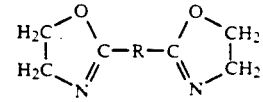

in which R is a divalent linking group.

2. The composition of claim 1 in which the molar ratio of the bisoxazoline to the bisimide is within the range of about 0.2 to about 5.0:1.

3. The composition of claim 1 in which the bisoxazoline is one in which R is selected from the group consisting of phenylene and $C_{1-10}$ alkylene.

4. The composition of claim 1 in which the bisimide comprises N,N'-4,4'-diphenylmethane bismaleimide.

5. The composition of claim 4 in which the bisoxazoline is selected from the group consisting of 2,2'-(1,3-phenylene)bisoxazoline and 2,2'-(1,4-phenylene)bisoxazoline.

6. The composition of claim 5 in which the molar ratio of bisoxazoline to the bisimide is within the range of about 0.5 (o 2.0:1.

7. The composition of claim '1 which further comprises from about 0.002 to about 0.2 mole, per mole of the bisimide, of a free radical polymerization inhibitor.

8. The composition of claim 7 in which the free radical polymerization inhibitor is phenothiazine.

9. The composition of claim 3 in which the bisimide comprises N,N'-4,4'-diphenylmethane bismaleimide.

10. The composition of claim 9 which further comprises from about 0.0002 to about 0.2 mole, per mole of the bisimide, of phenothiazine.

11. The composition of claim 10 in which the bisoxazoline comprises 2,2'-(1,3-phenylene)bisoxazoline.

12. The composition of claim 1 which further comprises a fibrous reinforcing agent.

13. The composition of claim 9 which further comprises carbon fibers.

14. The composition of claim 9 which further comprises glass fibers.

15. An article of manufacture comprising a cured composition as defined by claim 1.

16. An article of manufacture comprising a cured composition as defined by claim 12.

17. An electrical laminate comprising the composition of claim 14.

18. A bisimide copolymer prepared by heating the composition of claim 1 at a temperature of at least about 180° C. for at least about 2 hours.

19. A bisimide copolymer prepared by heating the composition of claim 10 at a temperature within the range of about 200° C. to about 350° C. for at least about 2 hours.

20. A method for increasing the fracture toughness of a cured bisimide of an unsaturated dicarboxylic acid represented by the formula

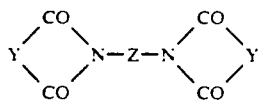

in which Y is a substituted or unsubstituted divalent group containing at least 2 carbon atoms and a carbon-carbon double bond, and Z is a divalent linking group, the method comprising (a) blending with the bisimide, in uncured form, from about 0.2 to about 5.0 moles, per mole of the bisimide, of a bisoxazoline according to the formula

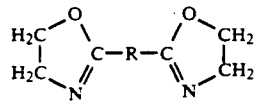

in which R is a divalent linking group, and (b) heating the resulting blend to a temperature within the range of about 200° to about 350° C. for a time of at least about 2 hours.

21. The method of claim 20 in which the bisoxazoline is one in which R is selected from substituted or unsubstituted phenylene and $C_{1-10}$ alkylene.

22. The method of claim 20 which further comprises blending with the bisimide from about 0.0002 to about 0.02 mole of a free radical polymerization inhibitor.

23. The method of claim 20 in which the bisimide comprises N,N'-4,4'-diphenylmethane bismaleimide.

24. The method of claim 23 in which the bisoxazoline is 2,2'-(1,3-phenylene)bisoxazoline.

* * * * *